United States Patent [19]
Heitmann

[11] Patent Number: 5,276,708
[45] Date of Patent: Jan. 4, 1994

[54] CODING METHOD FOR REDUCING THE D.C. COMPONENT IN THE DATA STREAM OF A DIGITAL SIGNAL

[75] Inventor: Jürgen Heitmann, Alsbach-Hähnlein, Fed. Rep. of Germany

[73] Assignee: BTS Broadcast Television Systems GmbH, Darmstadt, Fed. Rep. of Germany

[21] Appl. No.: 822,096

[22] Filed: Jan. 17, 1992

[30] Foreign Application Priority Data

Jan. 25, 1991 [DE] Fed. Rep. of Germany ....... 4102149

[51] Int. Cl.⁵ .............................................. H04L 25/34
[52] U.S. Cl. .......................................... 375/19; 375/34; 371/57.1; 341/58
[58] Field of Search ............... 375/17, 19, 34; 371/57.1, 57.2; 341/58

[56] References Cited

U.S. PATENT DOCUMENTS

| | | | |
|---|---|---|---|
| 4,310,860 | 1/1982 | Leiner | 360/40 |
| 4,387,364 | 6/1983 | Shirota | 375/19 |
| 4,491,869 | 1/1985 | Heitmann | 358/141 |
| 4,620,311 | 10/1986 | Schouhamer Immink | 341/58 |
| 4,698,809 | 10/1987 | Munter | 375/19 |
| 5,042,037 | 8/1991 | Endoh | 344/58 |

FOREIGN PATENT DOCUMENTS

3113397C2 10/1982 Fed. Rep. of Germany .
2232858 12/1990 United Kingdom ................ 375/19

Primary Examiner—Stephen Chin
Attorney, Agent, or Firm—Frishauf, Holtz, Goodman & Woodward

[57] ABSTRACT

For reducing the d.c. component of a digital signal in which a good many data words are put together in data blocks each having the same number of words, a supplementary word is derived and is transmitted or stored along with the data words. The bit mix of the supplementary word contains information for shifting the word bit-mix range, defined in accordance with the d.c. component of various words of the data words in the data block. The bit-mix value of the supplementary word is derived by evaluation of the weighting of ASE-coded data words in the data block, this being done in a manner dependent on the standard deviation and an expected value or center of gravity of the data block. A difference value determined with respect to the center of gravity and the value of a middle level value of a data word represents the value of the supplementary word with which, by the use of the modulo-2 addition the digital signal is shifted in bit-mix value range. The supplementary word is transmitted or recorded with each data block and is used in an operation which is the inverse of what is done before recording or transmission so that the original digital signal will be available again.

7 Claims, 3 Drawing Sheets

CODING METHOD FOR REDUCING THE D.C. COMPONENT IN THE DATA STREAM OF A DIGITAL SIGNAL This invention is in the field of coding methods and procedures for reducing the d.c. component in a word-by-word orientated data stream of a digital signal, in which the digital signal consists of data blocks each containing m words.

BACKGROUND AND PRIOR ART

A pulse code modulation system is known from German Patent Publication DE 31 13 397 C2 and U.S. Pat. No. 4,491,869, in which a digital signal is passed through a recording or transmission channel having a high-pass characteristic. In this system the bandwidth of the analog signal on which the digital signal is based is limited to the extent that the highest frequencies contained in the band-limited analog signal are smaller than half of the sampling frequency which is used for analog-to-digital conversion. The digital signal is inverted from sample to sample and thereafter a code is established by which within a word the number of bits having one of the logic levels has a linear dependence on the corresponding value of the analog signal. From German Patent DE 28 28 219 A1 and U.S. Pat. No. 4,310,860, a method for transmitting digitally coded signals is known in which the stream of individual data words of a given data stream is subdivided into sequences with and without d.c. component and the sequences having a d.c. component are replaced by sequences without a d.c. component.

SUMMARY OF THE INVENTION

It is an object of the present invention to provide a coding method for a word-oriented data stream of a digital signal in the use of which the presence of d.c. or low-frequency components in the digital signal is greatly reduced.

Briefly, the bit-mix value range of the data word values in every data block is shifted by use of a logic operation using the value of a supplemental word. That supplemental word value is determined by evaluation of the corresponding data block with reference to the frequency and distribution of logic levels (i.e. of the bix mix) within the data block. The logic operation produces a measurement of an evaluated distribution of logic levels in the value-range-shifted (modified) data block. Then, after transmission or recording and reception or playback, a reversal or inversion of the logic operation with the value of the supplementary word retrieves the original data block in its original value range.

In another aspect of the invention, after every word by word step of bit-mix value-range-shifting of the data block by the logic utilizing the value of a supplementary word, the d.c. component of the (modified) value-range-shifted data block is reported. Modified data blocks with the supplementary words belonging to them are selected for transmission or recording which have the smallest d.c. component in comparison with other steps of shift modification of the respective unmodified data blocks. At the receiving end of the transmission or in the playback of a recording, by an inversion of the logic operation with the value of the supplementary word, the original (unmodified) data block with its original value range is retrieved.

The method of the invention has the advantage that by redundant addition of a certain data word following the m data words of a data block the spectrum of the data block is fitted to the characteristic of a transmission channel. In the case of magnetic storing of digital signals through a band-limited recording/reproduction channel it is possible for the d.c. component, which is not capable of being recorded, to shift the value ranges in the data stream of the digital signal in such a way that for the value range of a data block freedom from d.c. is accomplished.

Further elaborations and modifications of the invention will now be described by way of illustrative example, with reference to the annexed drawings, in which:

DESCRIPTION OF THE ILLUSTRATED EXAMPLES

Figure 1:
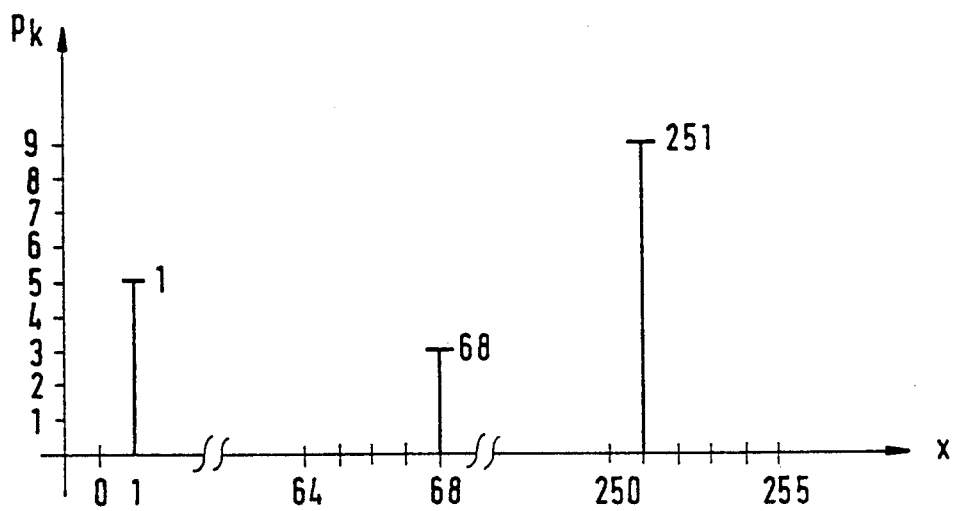
FIG. 1 is representation of a distribution of certain data words in a data block before a shifting of the value range of the data words.

For recording digital signals on a magnetic carrier a large number of codes are known, for example NRZ-L-, NRZ-I-, Bi-Φ-, Miller Code and Miller$^2$ Code, among which there is a great deal of difference of the distribution of power over the spectrum. A channel code which is particularly well suited to the recording and reproduction channel of a magnetic tape apparatus with reference to the spectral power density is the so-called ASE code which is known from the above-mentioned German Patent Publication DE 31 13 397 C2. In this code there is provided, with reference to the distribution and frequency of logic ones of a data word, a somewhat linear dependence on the corresponding value of an analog signal, so that from logic step to logic step (sample to sample) of the ASE code only one or two bits need to be changed. By a "somewhat linear dependence" is meant that one function (i.e. one variable) is never diminished as the other is unchanged or is increased. This may be more explicitly referred to as monotonic dependence.

A data word that is 8 bits wide permits quantization in 256 steps. In this value range there are contained:

1 data word without any logic "1",
8 data words with one logic "1",
28 data words with two logic "1",
56 data words with three logic "1",
70 data words with four logic "1",
56 data words with five logic "1",
28 data words with six logic "1",
8 data words with seven logic "1" and
1 data word with eight logic "1".

In this value range there are favorable and unfavorable partial ranges with respect to the d.c. component. Data words that have the same number of logic "0" and logic "1" are to be regarded as free of d.c. component and thereby provide a most favorable partial range of values. At the other extreme, data words which contain only "0" or only "1" are most unfavorable.

In accordance with the teaching of the method of the invention, the signal to be transmitted or recorded is word-value-shifted n order to get into a more favorable range from a less favorable range. The word value shifting information inserted by this procedure is stored as a redundant supplementary word which is transmitted or stored along with the rest of the transmission or recording, in order to make possible the restoration of the original signal at the receiving end of a transmission or at the playback stage provided for the a record.

In a first illustrative embodiment 256 data words having a word width of 8 bits are collected every time into a data block and provided with a supplementary word of the shift information. The value of the supplementary word depends on the expected value of the data distribution in a block, which can be regarded as a center of mass or gravity, with the higher binary value bits "1" are regarded as massive, and it also depends on the standard deviation relating to that center value.

For clarification it may be assumed that a signal is present as a serial sequence of data words which are coded in accordance with the above-mentioned ASE coding rules. For reasons of simplification it may be further assumed that a data block of 17 words is present. In such a data block there can be:

- 5 words of the value 1 (ASE binary value: 1000 0000),
- 3 words of the value 68 (ASE binary value: 0100 1010) and
- 9 words of the value 251 (ASE binary value: 1110 1111).

An expected value $\alpha_1$ is determined by the equation $$\alpha_1 = \sum_{k=1}^{m} x_k \cdot p_k,$$

wherein m is the number of words per data block, x is the possible value of a value scale from x=0 to x=255 and p is the number of words per data word kind x. The expected value $\alpha_1$ is thus $$\alpha_1 = ((0*0)+(5*1)+(0*2)+\ldots+(3*68)+\ldots +(9*251))/17$$

$$\alpha_1 = 145.17$$

A standard deviation $DX_1$ is determined by the equation $$DX_1 = \sum_{k=1}^{m} (x_k - \alpha_1)^2 \cdot p_k$$

with the values above described, then $$DX_1 = (1-145.17)^2*5+(68-145.17)^2*3+(251-145.17)^2*9$$

$$DX_1 = 222590.47.$$

A standard deviation $DX_2$ is further calculated for a digital signal that is value-shifted about the value 128 by a modulo-2 addition, in order to take account of a corresponding ring-shift of the data block. In this case, from the five words of the value 1 the value 129 is obtained, from the three words of the value 68 the value 196 is obtained and from the nine words of the value 251, the value 123 is obtained. With these values there can be calculated the following expected value:

$$\alpha_2 = [(9\times123)+(5+129)+(3\times196)]/17 = 137.64.$$

For the procedure of a ring shift there is a standard deviation $DX_2$:

$$DX_2 = \sum_{k=1}^{m} (X_k - \alpha_2)^2 \cdot p_k.$$

With the calculated expected value $\alpha_2$, the standard deviation is:

$$DX_2 = (123-137.69)^2*9+(129-137.69)^2*5+(196-137.64)^2*3$$

$$DX_2 = 12519.8$$

When $DX_2 < DX_1$ the expected value $\alpha_1$ is shifted by 128 by a modulo-2 addition, so that finally the expected value $\alpha = \alpha_1 + 128 = 17.17$.

In a next step all values of the data words of the data blocks are shifted in a modulo-2 addition by the modulo-2 difference between the expected value and 128, which represents the middle of the ASE code. Modulo-2 addition or modulo-2 subtraction signifies that every binary place of two data words are added subtracted without carry, so that $0+/-0=0$, $0+/-1=1$, $1+/-0=1$ and $1+/-1=0$.

The new value of every data word is thus obtained from the original value of the data word and a modulo-2 addition of the modulo-2 difference value obtained from the value 128 minus the calculated expected value $\alpha$. With the assumed count numbers of the 17 data words, the value 1 then takes on the count value 112, the value 68 the count value 179 and the value 251 the count value 106.

A checking of these count values with respect to the expected value or center of gravity shows that the center of gravity of a data block thus modified is shifted to 128. The obtained value of the supplementary word of the shift information $(128-\alpha)=111$, which in the present example was used for modulo-2 addition, is, in the case of magnetic storage, allocated to the data block in question and recorded with it.

In a serial transmission of data blocks the supplementary word is added to the data block and likewise transmitted so that by a modulo-2 subtraction at the receiving end the original signal of the data words in the data block can again be obtained.

FIG. 1 shows a representation of a distribution of the values of data words in a data block before coding that are used in this particular example. On the ordinate the scale is the number of words per data word kind x and on the abscissa there is plotted the corresponding data word kind x. By a modulo-2 addition with the average value $256/2=128$ there is produced a ring shift of the data words that happen to be in a data block.

Figure 2:
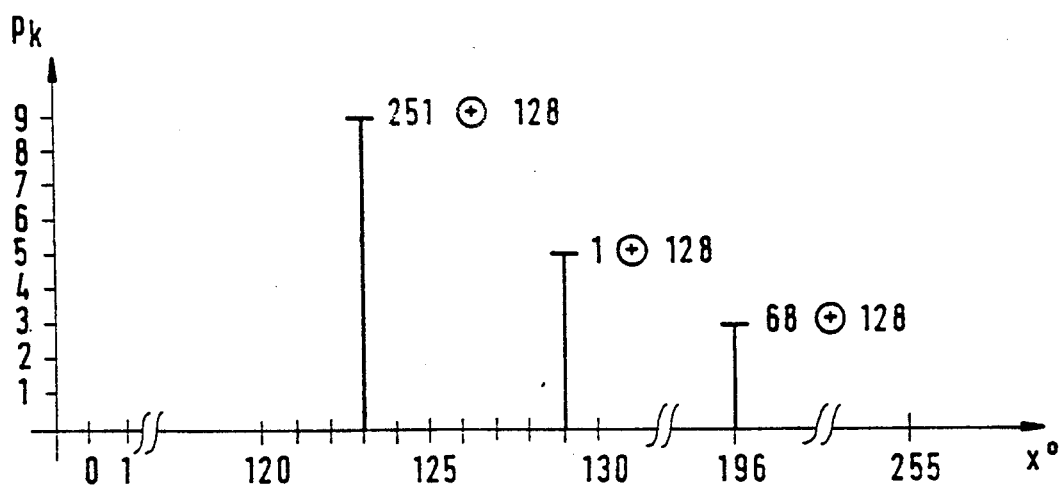
FIG. 2 is a representation corresponding to FIG. 1 with a ring-like distribution of the particular data words.

FIG. 2 shows the values of data words represented in FIG. 1 after such a ring shift, which—as mentioned in the introduction to this subject—is used for derivation of the "true" location of a so-called center of gravity on a scale of position values.

In two tables set forth below there are shown the changes of the d.c. component by use of the coding method of the present invention.

TABLE 1

| Decimal Value | ASE Binary Value | Deviation from Freedom from D.C. | Number of Words | D.C. Component |
|---|---|---|---|---|
| 1 | 1000 0000 | −3 | 5 | −15 |
| 68 | 0100 1010 | −1 | 3 | −3 |
| 251 | 1110 1111 | +3 | 9 | +27 |
| Overall D.C. component before coding: | | | | +9 |

TABLE 2

| Decimal Value | ASE Binary Value | Deviation from Freedom from D.C. | Number of Words | D.C. Component |
|---|---|---|---|---|
| 112 | 1010 1100 | 0 | 5 | 0 |
| 179 | 1100 1110 | +1 | 3 | +3 |
| 106 | 1100 0101 | 0 | 9 | 0 |
| Overall D.C. component before coding: | | | | +3 |

In Table 1 there are shown, by means of the data word values used in the illustrative example, the d.c. component before coding and Table 2 shows the corresponding d.c. component after coding as prescribed by the present invention. It is to be noted that the overall d.c. component after that coding (+3) is smaller than the overall d.c. component before coding (+9). Since in the illustrated example only 17 data words per data block were considered, an improvement of the overall d.c. component by only the factor 3 is obtained. The overall d.c. component converges however towards zero, so that when the number of data words m within a data block becomes very much larger, the d.c. component practically vanishes.

Figure 3:
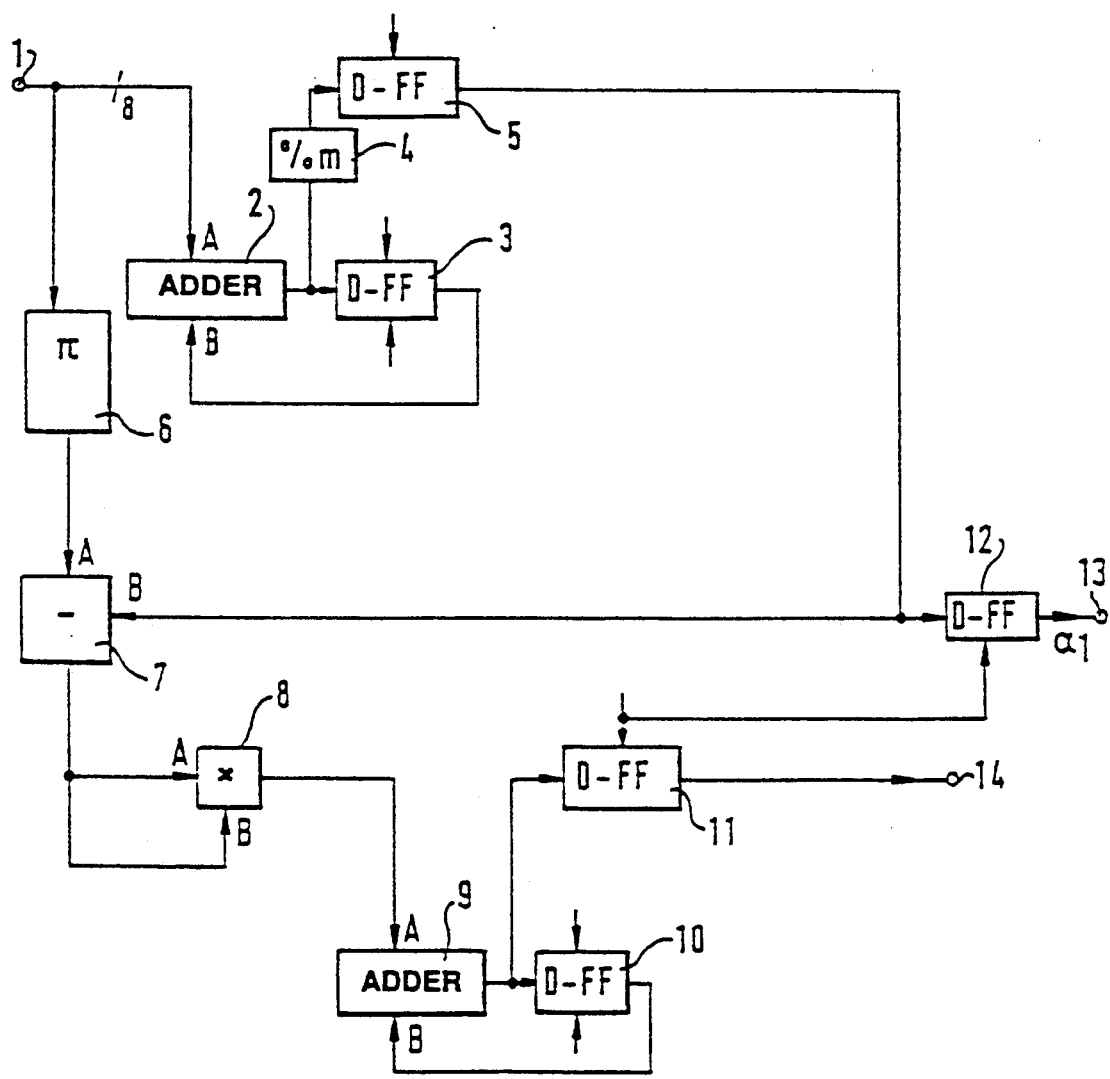
FIG. 3 is the first part of a circuit block diagram of apparatus for carrying out the method of the invention.
Figure 4:
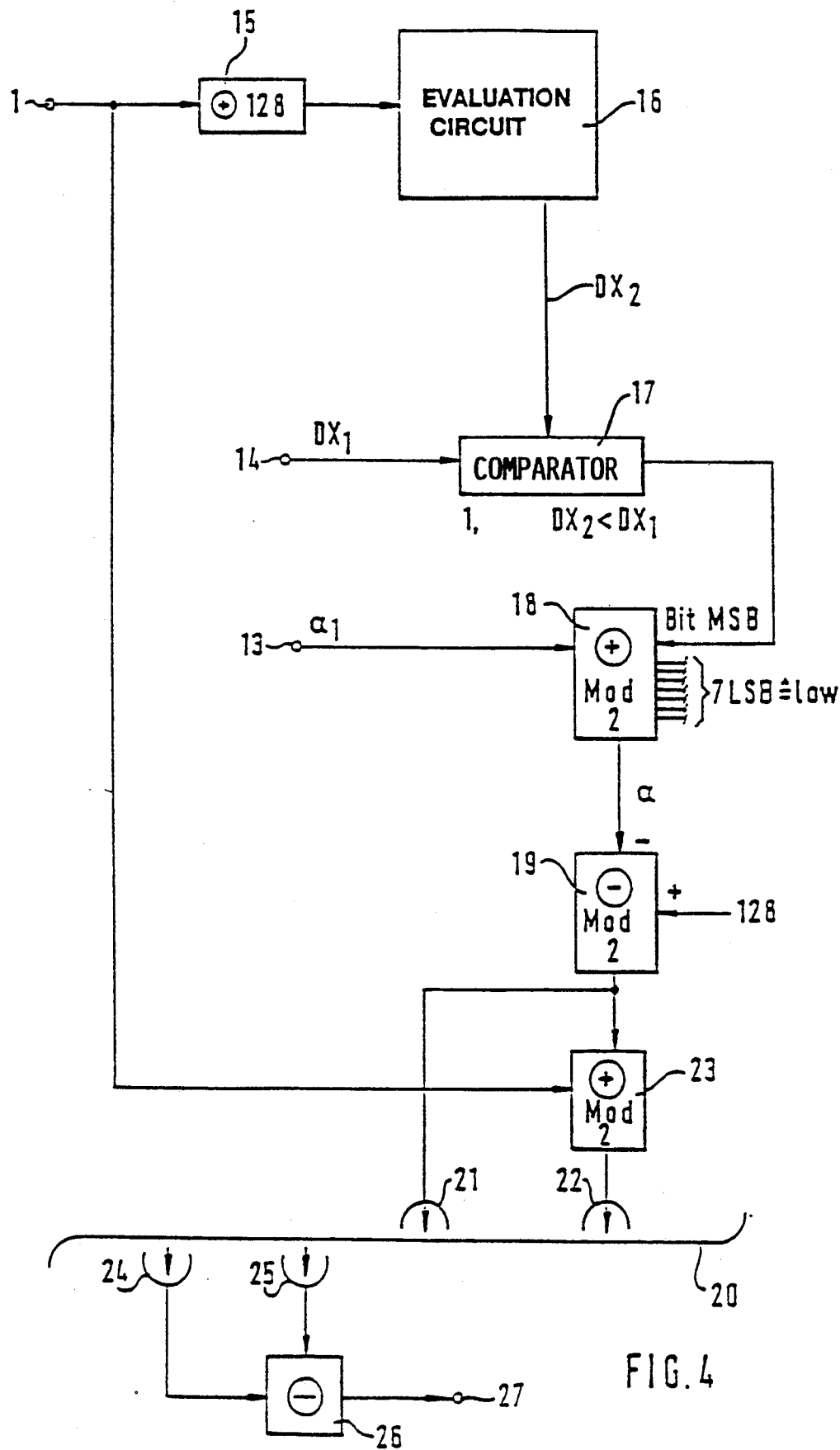
FIG. 4 is the remaining part of the circuit block diagram of which the first part is shown in FIG. 3.

With the circuit block diagrams shown in FIGS. 3 and 4 the value of a supplementary word of the shift information can be obtained which, together with the data of a modified data block, is recorded on a magnetic carrier and is again picked up from this carrier in order to produce the original value range of the data block. For that purpose, the data stream of a digital signal present at a terminal 1 is supplied to an accumulator consisting of an adder 2 and a D flipflop 3, in order to carry out a summation of the data words that are present for deriving therefrom the expected value $\alpha_1$. The D flipflop 3 in this operation takes over word-by-word the sum values provided by the adder 2. At the beginning of a data block the D flipflop 3 serving as a storage register is set to the null value. The sum signal available at the output of the adder 2 is then divided by means of a divider 4 by the number m of the data words per data block and the resulting value (center of gravity $\alpha_1$) is stored at the end of the data block in a register 5.

In a next step the standard deviation $DX_1$ is determined. The digital signal present at the terminal 1 is delayed in a delay device 6 for the signal processing time of the stages 2–5 and then supplied to the input A of a subtraction stage 7. The input B of the subtraction stage 7 is connected with the output of the register 5. In the subtraction stage 7 the difference value $(x_k - \alpha_1)$ of the standard deviation equation $$DX_1 = \sum_{k=1}^{m} (x_k - \alpha_1)^2 \cdot p_k$$

is determined. By means of a multiplication stage 8 the difference value thus determined is squared and supplied to another accumulator which consists of an adder 9 and a register 10. This register 10 is also clocked word-by-word and is reset to null at the beginning of every data block. The value of the standard deviation $DX_1$ obtained by a succession of sums is then stored at the end of a data block in still another register 11. The value of the center of gravity $\alpha_1$ is stored in a register 12 at the end of a data block for the duration of a data block and is made available at a terminal 13 for a further data processing operation. The standard deviation signal $DX_1$ stored in the register 11 is made available at a terminal 14.

In FIG. 4 the elements of FIG. 3 having the same effect are designated with the same reference numerals. In order to take account of the possibility of a ring shift of a data block, the data stream which is present at 1 is modulo-2 added to the value 128 in a stage 15. The digital signal thus prepared is then evaluated in a circuit 16, which has the circuit block structure of FIG. 3, with regard to the center of gravity $\alpha_2$ and the standard deviation $DX_2$. The standard deviation $DX_2$ obtained by this evaluation is compared, in a comparator 17, with the standard deviation $DX_1$ present at the terminal 14. In the event that $DX_2$ is smaller than $DX_1$, the comparator 17 provides a signal with the logic level "1", which is added in a modulo-2 addition stage 18 as the MSB (most significant bit) to the value of the center of gravity $\alpha_1$ (terminal 13), in order to derive a center of gravity $\alpha$. The value of the center of gravity $\alpha$ is subtracted in a modulo-2 subtraction stage 19 from the middle value 128 of the ASE code. At the output of the modulo-2 subtraction stage 19 the supplementary word of the shift information can be obtained, which in the case of magnetic storage is recorded with a magnetic head 21 on a magnetic tape 20. In parallel to the supplementary word, the data words of the corresponding data block are recorded with a further magnetic head 22. These data words are processed by a modulo-2 addition in a modulo-2 addition stage 23 in a manner dependent upon the value of the supplementary word and produce the digital signal available at the terminal 1.

On the playback side, the modified data words of a data block and the corresponding supplementary word from the magnetic tape are picked up by means of the playback magnetic heads 24 and 25 and are shifted back into the original value range by a modulo-2 subtraction in a stage 26, so that the original data signal is again available at the output terminal 27.

In the above-described illustrative example the value of the supplementary word of the shift information was determined as depending on the center of gravity and the standard deviation of a distribution of values of the data words contained in a data block. Of course it is also possible to provide the value of the supplementary word of the shift information in another way. For example it is contemplated that every position within the value range of a particular evaluation value could be assigned to a determined evaluation number, the magnitude of which is in a proportional relation to the d.c. component. With this evaluation magnitude the data words at the individual positions can be evaluated and the data block shifted in the value range 256 times by one step. For each shift characteristic number is derived which is produced by summing of the evaluation values. The ultimate (optimal) value of the supplementary word of the shift information is then found when the value of the determined characteristic number is a maximum. Since this derivation of the shift information in this kind of embodiment is relatively expensive in circuit technology, it is to be recommended that such a coding should be carried out under the control of a program by a microcomputer.

It should further be observed that in the illustrated example the word width of 8 bits per data word and the number of the data words per data block can of course be changed and the method of the invention can still be used to derive the value of the supplementary word. It will therefore be seen that although the invention has been described with reference to a particular illustrative example, modifications and variations are possible within the inventive concept.

I claim:

1. A coding method for reducing the d.c. component in a word-by-word data stream of a digital signal of which the words all have the same number of bits, comprising the steps of:

grouping data words of said data stream into data blocks each containing the same number (m) of data words, each said data word having a word value dependent upon its mix of 1 and 0 bits, said word values of words of each data block occupying a word value range extending between a minimum value and a maximum value for said data block, deriving a supplementary word for each data block from the bunching and distribution of logic levels within the respective blocks, said supplementary word having a word value dependent on its mix of 1 and 0 bits;

shifting the word value range of each data block by a logic operation utilizing the word value of the supplementary word of the respective block, said logic operation producing a maximum balance of the mix of 1 and 0 bits in the data block of which the word value range is shifted;

utilizing said data blocks for which the word value range was shifted, together with said supplementary words thereof, for transmission or recording, followed by reception or playback, and thereafter applying an inversion of said logic operation to said data blocks of shifted word value range and said supplementary words thereof and thereby retrieving the original data blocks into which said data words of said data stream were grouped.

2. A coding method for reducing the d.c. component in a word-by-word data stream of a digital signal of which the words all have the same number of bits, comprising the steps of:

grouping data words of said data stream into data blocks each containing the same number (m) of data words, each said data word having a word value dependent on its mix of 1 and 0 bits, a word value range being defined for each data block as extending between a minimum and a maximum of word value for said data block;

deriving a supplementary word for each data block from the bunching and distribution of logic levels within the respective blocks, said supplementary word having a word value dependent on its mix of 1 and 0 bits;

shifting the word value range of each data block by a logic operation in word-by-word steps utilizing said supplementary word of the respective block, each step of said operation producing a modified data block;

after every word-by-word step of said logic operation, determining the d.c. component in the modified data block produced by the respective step;

selecting, for transmission or recording, that one of the modified data blocks produced by word-by-word steps which has the smallest d.c. component in comparison with other modified data blocks derived word-by-word from the same original data block;

after transmission or recording and reception or playback of each said modified data block which has been selected for transmission or recording, together with said supplementary word thereof, applying an inversion of said logic operation to each said modified data block which has been transmitted or recorded and said supplementary word thereof and thereby retrieving the original data words of said data stream which were grouped into blocks.

3. The coding method of claim 1, wherein said logic operation utilizes a modulo-2 addition.

4. The coding method of claim 2, wherein said logic operation utilizes a modulo-2 addition.

5. The coding method of claim 1, wherein there is a preliminary step of deriving a first binary sequence by putting said digital signal into a code for which within a data word the number of bits with one of two possible logic levels has a monotonic dependence upon the value of an analog signal and wherein within said first binary sequence m data words are grouped into data blocks and thereafter each data block is evaluated with respect to its logic weighting and the position of a center of gravity determined from the bit distribution in the data block is derived;

wherein, further, for deriving a secondary binary sequence from the data words of said first binary sequence, the value of each said supplementary word derived for a said data block is modulo-2 added, the supplementary word being determined from the difference between the middle position of the word value range and the determined center of gravity position, and wherein during said transmission or recording each said data block of said second binary sequence is followed by the said supplementary word of the respective data block and in the step by which the original data blocks are retrieved, the received or played back data words of said second binary sequence are subjected to modulo-2 subtraction of the supplementary word of the respective data block.

6. The coding method of claim 2, wherein with an evaluation function, there are determined minima and maxima of a distribution of logic "0" and "1" levels in the value range of each data block, and a binary sequence is produced which is the basis of a code by which within a data word the number of bits with one of the logic levels has a monotonic dependence on the instantaneous value of an analog signal, and wherein every position within the value range is assigned a particular value, the magnitude of which is indicative of the magnitude of the d.c. component that is present, and wherein, by means of said indicative values, the data words at the individual positions of the data block are evaluated, said data blocks then being shifted by word-by-word steps with respect to their value range, a characteristic number being derived, for each said step, which is produced by summing of the word values within the block which have been evaluated and wherein such a data block which has the maximum characteristic number is selected for the transmission or recording step.

7. The method of claim 5, wherein an expected value $a_1$ of a said supplementary word and a standard deviation $DX_1$ for supplementary word value are determined according to the following relations:

$$a_1 = \sum_{k=1}^{m} x_k * p_k,$$

$$DX_1 = \sum_{k=1}^{m} (x_k - a_1)^2 * p_k$$

wherein m is the number of data words per data block, x is a value scale corresponding to the quantization range of a data word and p is the number of data words of each data word kind x, and wherein for taking account of a ring shift said first binary sequence is modulo-2 added to a value m/2 and a second expected supplementary word value $a_2$ and a standard deviation $DX_2$ related thereto are determined by means of the resulting data words according to the following relations:

$$a_2 = \sum_{k=1}^{m} x_k * p_k,$$

$$DX_2 = \sum_{k=1}^{m} (x_k - a_2)^2 * p_k$$

and wherein if $DX_2$ is less than $DX_1$ the expected value $a_1$ is shifted about the value m/2 by a modulo-2 addition.

* * * * *